United States Patent
Lee et al.

(10) Patent No.: US 6,207,535 B1
(45) Date of Patent: Mar. 27, 2001

(54) METHOD OF FORMING SHALLOW TRENCH ISOLATION

(75) Inventors: Kan-Yuan Lee, Tainan Hsien; Joe Ko, Hsinchu; Yang-Hui Fang, Tainan Hsien; Gary Hong, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/531,903

(22) Filed: Mar. 20, 2000

(30) Foreign Application Priority Data

Jan. 24, 2000 (TW) ................................. 089101070

(51) Int. Cl.⁷ .................................................. H01L 21/76
(52) U.S. Cl. .......................... 438/435; 438/424; 438/437; 148/DIG. 50
(58) Field of Search ................................... 438/424, 435, 438/436, 437, 438; 148/DIG. 50

(56) References Cited

U.S. PATENT DOCUMENTS

| | | | |
|---|---|---|---|
| 5,786,262 | * 8/2000 | Jang et al. | 438/424 |
| 5,885,883 | * 3/1999 | Park et al. | 438/435 |
| 5,960,299 | * 9/1999 | Yew et al. | 438/437 |
| 6,033,970 | * 3/2000 | Park | 438/424 |
| 6,096,622 | * 8/2000 | Kim et al. | 438/435 |

FOREIGN PATENT DOCUMENTS

959496 * 11/1999 (EP) .

* cited by examiner

*Primary Examiner*—Trung Dang
(74) *Attorney, Agent, or Firm*—Jiawei Huang; J C Patents

(57) ABSTRACT

A method of fabricating shallow trench isolations (STI) which forms a substrate with a patterned first oxide layer and a patterned silicon nitride layer thereon, so that active regions are defined with openings formed between the active regions. The openings are then over etched to form trenches for fabricating the STI, followed by forming a second oxide layer that conforms to a profile of the trenches. A third oxide layer is globally formed over the second oxide layer, sidewalls of the first oxide layer, and the silicon nitride layer. A thermal process is performed to densify a portion of the third oxide layer, so that a top portion of the third oxide layer is harder than a lower portion of the third oxide layer. The excessive portion of the third oxide layer above the silicon nitride layer is removed by performing chemical mechanical polishing, which planarizes a top surface of the third oxide layer in order to complete the manufacture of the STI.

22 Claims, 3 Drawing Sheets

METHOD OF FORMING SHALLOW TRENCH ISOLATION

CROSS-REFERENCE TO RELATED APPLICATION

This application claims the priority benefit of Taiwan application serial no. 89101070, filed Jan. 24, 2000.

BACKGROUND OF THE INVENTION

1. Field of Invention

The present invention relates to a method of fabricating shallow trench isolations (STI). More particularly, the present invention relates to a method of fabricating the STI, which method solves the problems of microscratch and dislocation.

2. Description of Related Art

Implementing electric circuits involves connecting isolated devices through specific electrical paths, it is therefore be possible to isolate devices built into the silicon from one another when fabricating silicon integrated circuits. With advent of integrated circuits, it became necessary to provide electrical isolation between the devices fabricated on the same piece of silicon. One of the most important techniques developed conventionally for latchup protection was termed local oxidation of silicon (LOCOS) isolation, which involved the formation of a semirecessed oxide in the nonactive areas of the substrate.

As device geometries reached submicron size, conventional LOCOS isolation technologies reached the limits of their effectiveness, and alternative isolation processes were needed. Newer approach, such as shallow trench isolation, where shallow, refilled trenches are used primarily for isolating devices of the same type, is adopted to overcome some drawbacks of conventional LOCOS for small-geometry devices.

FIGS. 1A and 1B are cross-sectional views of two conventional STI structures refilled with different oxide layers. Referring to FIG. 1A, a buried-oxide (BOX) isolation technology is adopted to form a conventional STI. A substrate 100$a$ is provided with a pad oxide layer 102$a$ and a silicon nitride layer 104$a$ formed thereon, wherein the pad oxide layer 102$a$ serves to cushion the transition of stresses between the substrate 100$a$ and the silicon nitride layer 104$a$. Active regions (not shown) on the substrate 100$a$ are defined with a photolithographic step, followed by etching a part of the pad oxide layer 102$a$ and silicon nitride layer 104$a$ to form openings (not shown). The openings are then over-etched to form trenches 106$a$ in the substrate 100$a$, and the trenches 106$a$ are refilled by forming a layer of silicon oxide 108$a$ globally on the silicon nitride layer 104$a$. The method for forming the silicon oxide layer 108$a$ includes chemical vapor deposition (CVD). The silicon oxide layer 108$a$ is then planarized by chemical mechanical polishing (CMP), so that a part of the silicon oxide layer 108$a$ is removed until the silicon nitride layer 104$a$ is exposed. However, particles in the CMP slurry can damage the surface of the silicon oxide layer 108$a$, causing defects known as microscratches after CMP is performed. Furthermore, a portion of the silicon oxide layer 108$a$ is lost during a cleaning step, thus creating problem to control the profile of the STI.

A method to densify the silicon oxide layer was then suggested to solve the problem mentioned above and it is best illustrated in FIG. 1B. Accordingly, the conventional method for forming the silicon oxide layer is modified to solve the problem of microscratches resulted from CMP. From the diagram, an additional thermal treatment, such as thermal annealing, is performed to the silicon oxide layer so as to harden the silicon oxide layer 108$b$. Inevitably, there are also problems associated with this annealing technique as a harder silicon oxide layer creates stresses at the bottom of the STI. The stresses cause dislocations by compressing or distending a crystalline lattice of the substrate 100$b$, while the dislocations can interact with each other to affect the mechanical and electrical characteristics of the STI.

SUMMARY OF THE INVENTION

The invention provides a method of fabricating shallow trench isolations (STI), which method provides a substrate with a first oxide layer and a silicon nitride layer formed thereon. The first oxide layer and the silicon nitride layer are patterned to define active areas and form openings. The openings are then over etched to form trenches for fabricating the STI, followed by forming a second oxide layer that conforms to a profile of the trenches. A third oxide layer is globally formed to cover the second oxide layer, sidewalls of the first oxide layer, and the silicon nitride layer. A thermal process is performed to densify a portion of the third oxide layer, so that a top portion of the third oxide layer is harder than a lower portion of the third oxide layer. The excessive portion of the third oxide layer above the silicon nitride layer is removed by performing chemical mechanical polishing (CMP), which planarizes a top surface of the third oxide layer.

As embodied and broadly described herein, the invention provides a fabrication method of the STI, which forms the third oxide layer with a harder top portion and a softer lower portion. The method for forming the third oxide layer includes forming the third oxide layer by atmospheric pressure chemical vapor deposition (APCVD), performing a thermal annealing to the third oxide layer, and planarizing the third oxide layer. The top portion in this case is defined as a portion of the oxide layer higher than the second oxide layer, while the lower portion is defined as a portion of the oxide layer lower than the first oxide layer. Since the third oxide layer is a double layered structure having two different densities. The harder top portion of the third oxide layer can withstand any damage from CMP slurry when CMP is performed to planarize the surface of the third oxide layer. The softer lower portion of the third oxide layer, on the other hand, does not create stresses at the bottom of the STI, and thus does not produce dislocations that would affect the mechanical and electrical characteristics of the STI.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Description is made with reference to FIGS. 2A through 2E in the present embodiment, while steps and structures known to those skilled in the art will not be described in detail herein.

Figure 1A:
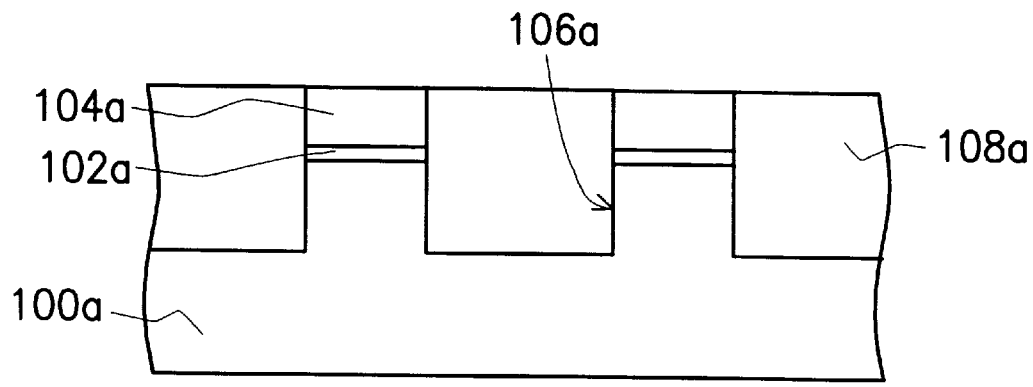
FIGS. 1A and 1B are cross-sectional views of two conventional STI structures refilled with different oxide layers.
Figure 1B:
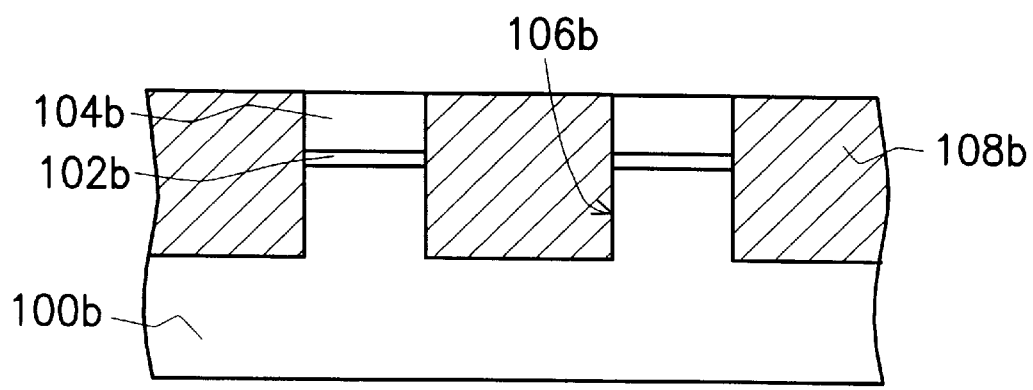
Figure 2A:
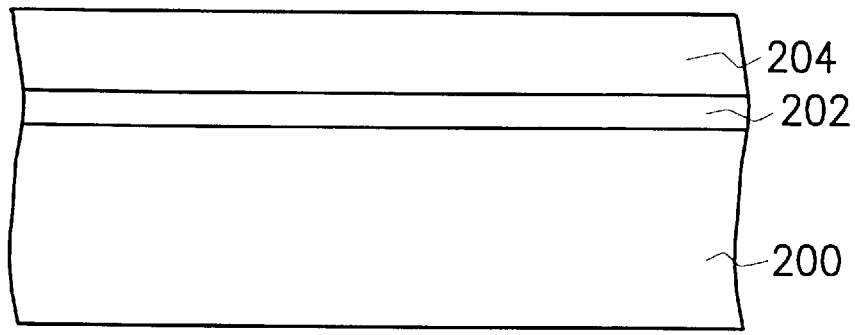
FIGS. 2A through 2E are schematic, cross-sectional diagrams illustrating a fabrication method of the STI according to one preferred embodiment of this invention.

Referring to FIG. 2A, a substrate 200 is provided with a pad oxide layer 202 formed thereon. The pad oxide layer 202 is preferably made of material such as silicon oxide, wherein the pad oxide layer 202 is formed by process, such as chemical vapor deposition (CVD), and has a thickness of about 100–200 angstroms. A silicon nitride layer 204 is then formed on the pad oxide layer 202, while the silicon nitride layer 204 has a thickness of about 1000–2000 angstroms.

Figure 2B:
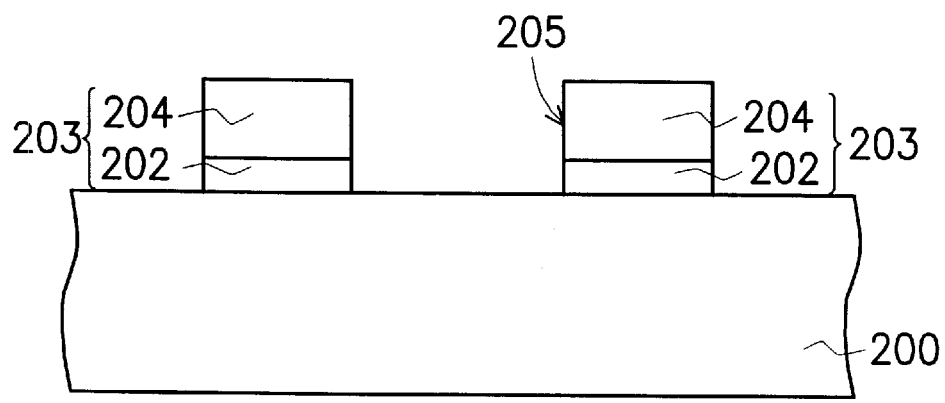
Figure 2C:
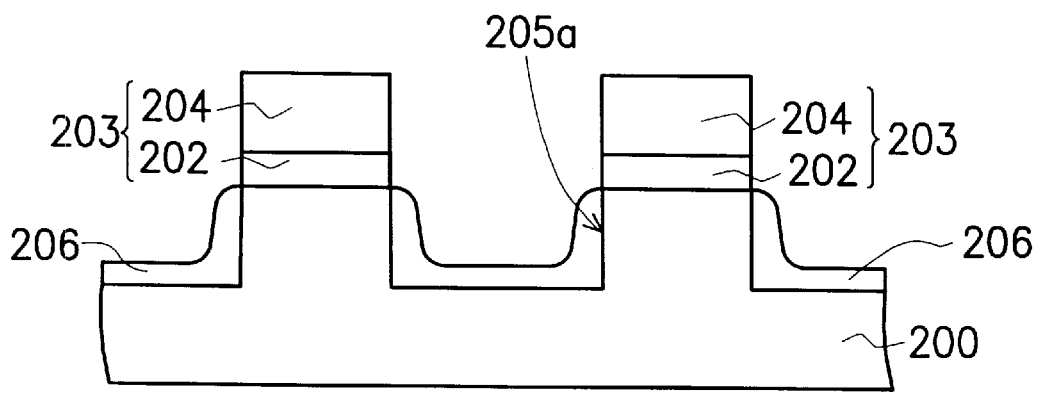

Referring to FIGS. 2B and 2C, the silicon nitride layer 204 and the pad oxide layer 202 are patterned so as to form active regions 203 and openings 205 defined by the active regions 203, wherein the openings 205 expose a part of the substrate 200. With the silicon nitride layer 204 serving as a mask, the exposed part of the substrate 200 is etched to form shallow trenches 205a. The shallow trenches 205a have a depth of about 5000–7000 angstroms, while the shallow trenches 205a are filled with a liner oxide layer 206, which is formed by thermal oxidation. The liner oxide layer 206 formed as such conforms to profile of the shallow trenches 205a and has a preferred thickness of about 200–500 angstroms. The liner oxide layer 206, in this case is adopted to improve the stress at the bottom of the STI, to serve as a better adhesion surface for an oxide layer and the substrate 200, and to provide a better isolating property.

Figure 2D:
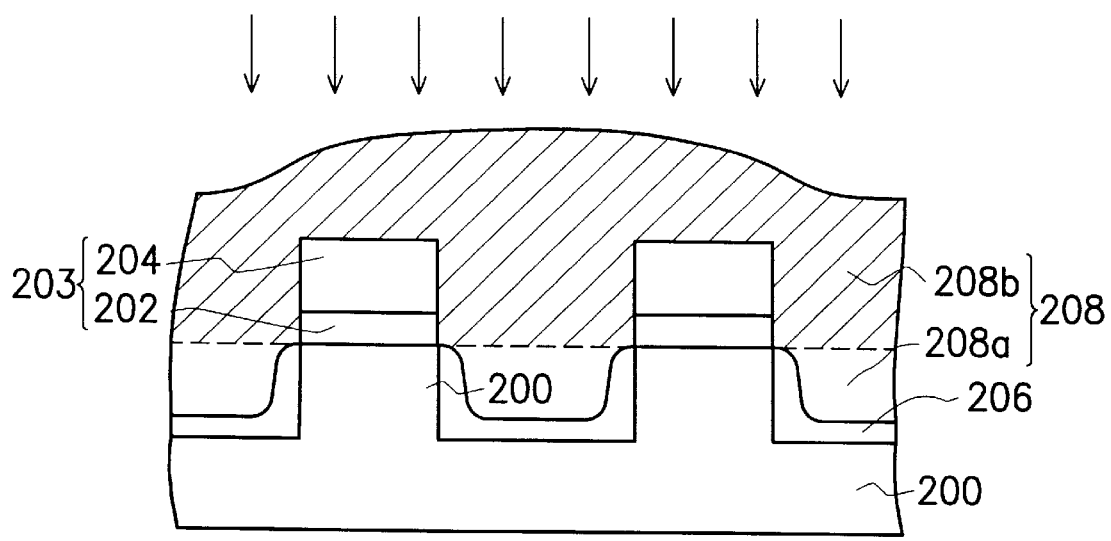

Referring to FIG. 2D, an oxide layer 208 is globally formed to cover the liner oxide layer 206, the sidewalls of the pad oxide layer 202, and the silicon nitride layer 204. The oxide layer 208 is formed by a method, such as atmospheric pressure chemical vapor deposition (APCVD), while the oxide layer 208 formed as such has a preferred thickness of about 5000–10000 angstroms. A thermal treatment, such as thermal annealing is performed to densify a portion of the oxide layer 208 using a heating source. The heating source is preferably a laser light source, which achieves a temperature of about 500–1500° C. to heat up top surface of the oxide layer, so that a top portion of the oxide layer 208b is harder than a lower portion of the oxide layer 208a. The top oxide layer 208b is defined as a portion of the oxide layer 208 higher than the liner oxide layer 206, while the bottom oxide layer 208a is a portion of the oxide layer 208 lower than the pad oxide layer 202.

Figure 2E:
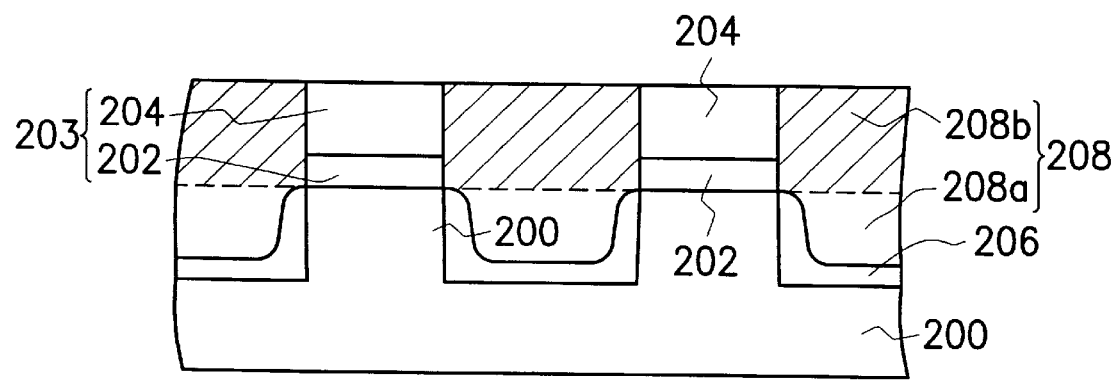

Referring to FIG. 2E, a portion of the top oxide layer 208b which is outside the shallow trench 205a is removed until the silicon nitride layer 204 is exposed. The method of removing the top oxide layer 208b includes chemical mechanical polishing (CMP). In addition, a cleaning step can be performed after CMP to clean any residues or CMP slurry that remain on the top oxide layer 208b. The harder top portion of the oxide layer 208b in this case can withstand any damage from CMP slurry when CMP is performed to planarize the surface of the third oxide layer. The softer lower portion of the third oxide layer 208a, on the other hand, does not create stresses at the bottom of the STI, and thus does not produce dislocations that would affect the mechanical and electrical characteristics of the STI.

Summarizing from the above, it is understood that the STI fabrication of the invention fills the trenches with an oxide layer which is partially densified by performing a thermal annealing using a laser light source. As a result, the oxide layer forms as mentioned above is made of a harder top portion and a softer bottom portion, whereby the two portions of the oxide layer exhibit two different densities. The harder top portion can withstand any damage from CMP slurry when CMP is performed, while the softer lower portion does not create stresses at the bottom of the STI, and thus does not produce dislocations that would affect the mechanical and electrical characteristics of the STI. Therefore, the STI fabricated according to the present invention is free from problems such as dislocation and microscratches, while the invention can be easily administered in the current STI process module.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for shallow trench isolations, the method comprising steps of:
   providing a substrate with a first oxide layer and a silicon nitride layer formed in sequence thereon;
   patterning the first oxide layer and the silicon nitride layer for defining active regions, wherein a portion of the first oxide layer and the silicon nitride layer are removed to form openings;
   performing an etching process, with the patterned silicon nitride layer serving as a mask, so as to form shallow trenches on the substrate;
   forming a second oxide layer for covering a profile of the isolation trenches;
   forming a third oxide layer for covering the patterned silicon nitride layer, sidewalls of the patterned first oxide layer, and the second oxide layer;
   performing a thermal annealing, so that a portion of the third oxide layer is hardened, while the other portion of the third oxide layer remains softened; and
   planarizing the hardened third oxide layer until the silicon nitride layer is exposed to complete the manufacture of the shallow trench isolations.

2. The fabrication method of claim 1, wherein the first oxide layer includes silicon oxide.

3. The fabrication method of claim 1, wherein the step of forming the first oxide layer includes chemical vapor deposition (CVD).

4. The fabrication method of claim 1, wherein the shallow trench has a depth of about 5000–7000 angstroms.

5. The fabrication method of claim 1, wherein the step of forming a second oxide layer includes thermal oxidation.

6. The fabrication method of claim 5, wherein the second oxide layer has a thickness of about 200–500 angstroms.

7. The fabrication method of claim 1, wherein the step of forming a third oxide layer includes atmospheric pressure chemical vapor deposition (APCVD).

8. The fabrication method of claim 7, wherein the third oxide layer has a thickness of about 5000–10000 angstroms.

9. The fabrication method of claim 1, wherein the thermal annealing includes irradiating the third oxide layer with a heating source.

10. The fabrication method of claim 9, wherein the heating source includes a laser light source.

11. The fabrication method of claim 9, wherein the thermal annealing is performed at a temperature of about 500–1500° C.

12. The fabrication method of claim 1, wherein the hardened portion of the third oxide layer is the portion of the third oxide layer higher than the second oxide layer.

13. The fabrication method of claim 1, wherein the softened portion of the third oxide layer is the portion of the third oxide layer lower than the first oxide layer.

14. The fabrication method of claim 1, wherein the step of planarizing the hardened third oxide layer includes chemical mechanical polishing (CMP).

15. A fabrication method for shallow trench isolations to improve problems of microscratches and dislocations, the method comprising steps of:

providing a substrate with a patterned silicon oxide layer and a patterned silicon nitride layer formed in sequence thereon, so that openings which are defined by active regions are formed on the substrate;

performing an etching process, with the patterned silicon nitride layer serving as a mask, so as to form isolating trenches on the substrate;

forming a thermal oxide layer for covering a profile of the isolating trenches;

forming an APCVD oxide layer for covering the patterned silicon nitride layer, sidewalls of the patterned first oxide layer, and the second oxide layer;

performing a thermal process, in which a top portion of the APCVD oxide layer is hardened, and the bottom portion of the APCVD oxide layer remains softened; and planarizing the hardened APCVD oxide layer by CMP until the silicon nitride layer is exposed to complete the manufacture of the shallow trench isolations.

16. The fabrication method of claim 15, wherein the isolating trench has a depth of about 5000–7000 angstroms.

17. The fabrication method of claim 15, wherein the thermal oxide layer has a thickness of about 200–500 angstroms.

18. The fabrication method of claim 15, wherein the APCVD oxide layer has a thickness of about 5000–10000 angstroms.

19. The fabrication method of claim 15, wherein the thermal process includes irradiating the APCVD oxide layer with a heating source, so that the hardened APCVD oxide layer is densified.

20. The fabrication method of claim 19, wherein the heating source includes a laser light source.

21. The fabrication method of claim 20, wherein the thermal process is performed using a laser light source at a temperature of about 500–1500° C.

22. The fabrication method of claim 15, further includes a cleaning step after CMP to clean any residues and CMP slurry that left on the planarized APCVD layer.

* * * * *